United States Patent
Saito

(10) Patent No.: US 9,673,826 B2
(45) Date of Patent: Jun. 6, 2017

(54) RECEIVING DEVICE

(71) Applicant: Kabushiki Kaisha Toshiba, Minato-ku (JP)

(72) Inventor: Toshitada Saito, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/840,304

(22) Filed: Aug. 31, 2015

(65) Prior Publication Data

US 2016/0269033 A1    Sep. 15, 2016

Related U.S. Application Data

(60) Provisional application No. 62/131,442, filed on Mar. 11, 2015.

(51) Int. Cl.
| | |
|---|---|
| *H03L 7/06* | (2006.01) |
| *H03L 7/07* | (2006.01) |
| *H03L 7/087* | (2006.01) |
| *H04L 7/033* | (2006.01) |
| *H03L 7/08* | (2006.01) |

(52) U.S. Cl.
CPC ............. *H03L 7/07* (2013.01); *H03L 7/0807* (2013.01); *H03L 7/087* (2013.01); *H04L 7/033* (2013.01); *H03L 7/0802* (2013.01)

(58) Field of Classification Search
CPC . H03L 7/07; H03L 7/0802; H03L 7/09; H03L 7/0891; H03L 7/18

USPC ....... 327/145, 144, 141, 146–148, 150, 151, 327/156, 157, 159, 161–163; 375/355, 375/362, 369, 373–376, 359; 331/16
See application file for complete search history.

(56) References Cited

U.S. PATENT DOCUMENTS

| | | | |
|---|---|---|---|
| 7,522,686 B2* | 4/2009 | Nam | H03L 7/0805 327/158 |
| 2006/0192622 A1* | 8/2006 | Narita | H03L 7/0805 331/16 |
| 2009/0147904 A1 | 6/2009 | Do et al. | |
| 2010/0232558 A1* | 9/2010 | Terada | H03L 7/0805 375/374 |
| 2013/0107997 A1* | 5/2013 | Chen | H03L 7/093 375/359 |
| 2013/0216014 A1* | 8/2013 | Kong | H03L 7/07 375/376 |

FOREIGN PATENT DOCUMENTS

JP    2009-302692    12/2009

* cited by examiner

*Primary Examiner* — Thomas Skibinski
(74) *Attorney, Agent, or Firm* — Oblon, McClelland, Maier & Neustadt, L.L.P.

(57) ABSTRACT

According to one embodiment, a receiving device includes a first PLL circuit, a second PLL circuit, and a control circuit. The first PLL circuit includes a first VCO and extracts a first clock from a received first packet. The second PLL circuit includes a second VCO and outputs a second clock acquired by multiplying the received clock by N. The control circuit applies a control signal of the second VCO to a first line controlling the first VCO during a first time from start of reception of the first packet.

16 Claims, 17 Drawing Sheets

RECEIVING DEVICE

CROSS-REFERENCE TO RELATED APPLICATIONS

This application is based upon and claims the benefit of priority from U.S. Provisional Application No. 62/131,442, filed on Mar. 11, 2015; the entire contents of which are incorporated herein by reference.

FIELD

Embodiments described herein relate generally to a receiving device.

BACKGROUND

A receiving device including a data transmission interface in which data (packet) and a clock are transmitted in parallel, generally, includes a clock data recovery (CDR) and a phase locked loop (PLL). The CDR reproduces a first clock from received data. The PLL generates a second clock that is acquired by multiplying received clock by N.

It is desired that the power consumption of a receiving device including a CDR and a PLL is reduced, and the lock-up time of the CDR and the PLL is shortened.

DETAILED DESCRIPTION

In general, according to one embodiment, a receiving device includes a first PLL circuit, a second PLL circuit, and a control circuit. The first PLL circuit includes a first VCO and extracts a first clock from a received first packet. The second PLL circuit includes a second VCO and outputs a second clock that is acquired by multiplying a received clock by N. The received clock described above has a frequency of 1/N of the bit rate of the first packet. Here, N is a natural number. The control circuit applies a control signal of the second VCO to a first line used for controlling the first VCO during a first time from the start of reception of the first packet.

Exemplary embodiments of receiving devices will be explained below in detail with reference to the accompanying drawings. The present invention is not limited to the following embodiments.

(First Embodiment)

Figure 1:
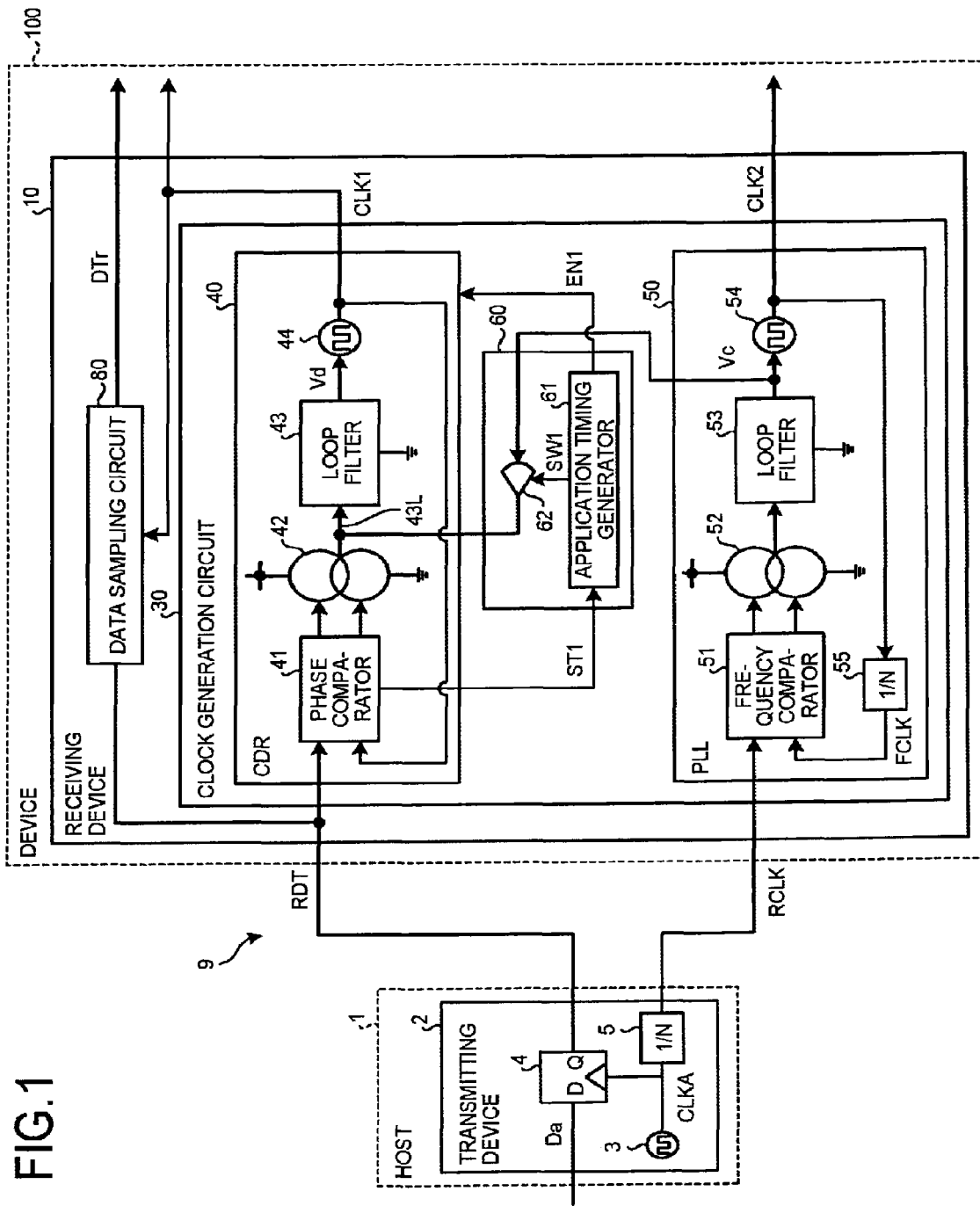
FIG. 1 is a block diagram that illustrates an example of the internal configuration of a receiving device according to a first embodiment.

FIG. 1 is a block diagram that illustrates an example of the configuration of a receiving device 10 according to a first embodiment. The receiving device 10 according to the first embodiment is mounted in a semiconductor device 100 that performs data reception. The semiconductor device 100 is connected to a host apparatus (hereinafter, referred to as a host) 1 that is a communication partner of the semiconductor device 100 through a communication line 9. In this embodiment, as a high-speed serial interface is used as the communication line 9 between the host 1 and the semiconductor device 100.

The host 1 transmits a packet (data) RDT and a clock RCLK in parallel through the communication line 9.

The host 1 includes a transmitting device 2. The transmitting device 2 includes an oscillator 3, a D-type flip-flop 4, and a frequency divider 5. The oscillator 3 generates a clock CLKA of a frequency f0. The D-type flip-flop 4 latches input data Da by using the clock CLKA generated from the oscillator 3 and transmits data RDT synchronized with the clock CLKA. The frequency divider divides the input clock CLKA by 1/N (here, N is a natural number) and outputs a clock RCLK of a divided frequency f0/N. In this way, the data RDT of the frequency f0 and the clock RCLK of the frequency f0/N are transmitted from the host 1 in parallel. In addition, the transmission of the clock RCLK is started at a time point of a predetermined time before the transmission of the data RDT is started.

The device 100 includes the receiving device 10. The receiving device 10 includes a clock generation circuit 30 and a data sampling circuit 80. The clock generation circuit 30 includes a clock data recovery (CDR) 40, a phase locked loop (PLL) 50, and a control voltage applying circuit 60 that functions as a control unit of the clock generation circuit 30.

The clock data recovery (CDR) 40 extracts a first clock CLK1 of a frequency f0, which is used for sampling reception data RDT, from the reception data RDT received from the host 1. The phase of the clock used for sampling the reception data RDT needs to coincide with the phase of the data RDT and is generated not from the clock RCLK but from the data RDT. The PLL 50 multiplies the received clock RCLK of a frequency f0/N by N to generate a second clock CLK2 of the frequency f0, which is acquired by performing multiplication by N, and outputs the second clock CLK2. Here, N is a natural number of one or more.

The first clock CLK1 output from the CDR 40 is input to various circuits including a sampling circuit 80 arranged inside the device 100. The sampling circuit 80 samples data from the reception data RDT based on the first clock CLK1. The sampling circuit 80 outputs the sampled data DTr to a predetermined circuit arranged inside the device 100. The second clock CLK2 output from the PLL 50 is input to various circuits arranged inside the device 100.

The CDR 40 and the PLL 50 individually operate independently. In this embodiment, in order to realize low power consumption, the CDR 40 is in a standby state and stops the operation when a packet (the reception data RDT) is not received. This control process, as will be described later, is performed by an application timing generator 61.

The PLL 50 (second PLL circuit) includes a frequency comparator 51, a charge pump 52, a loop filter 53, a voltage-controlled oscillator (VCO) 54, and a frequency divider 55.

The clock RCLK of the frequency f0/N received from the host 1 is input to one input, terminal of the frequency comparator 51, and a feedback clock FCLK is input to the other input terminal of the frequency comparator 51 from the frequency divider 55. The feedback clock FCLK is a clock acquired by dividing the second clock CLK2, which is an output clock generated by the VCO 54, by N.

The frequency comparator 51 compares the frequency of the clock RCLK with the frequency of the feedback clock FCLK and generates two control pulse signals (an up signal and a down signal) corresponding to a frequency difference thereof. In a case where the frequency of the clock RCLK is higher than the frequency of the feedback clock FCLK, the up signal is output to the charge pump 52. On the other hand, in a case where the frequency of the clock RCLK is lower than the frequency of the feedback clock FOLK, the down signal is output to the charge pump 52. The frequency comparator 51 activates the up signal or the down signal only for a time that is proportional to the detected frequency difference. In addition to the frequency difference between the clock RCLK and the feedback clock FOLK, the frequency comparator 51 also detects a phase difference therebetween.

The charge pump 52 converts the two control pulse signals (the up signal and the down signal) output from the frequency comparator 51 into analog signal and outputs the converted analog signal to the loop filter 53. In other words, the charge pump 52 generates a charge pump current corresponding to a frequency difference that is the output of the frequency comparator 51. The loop filter 53 includes a capacitor device and charges or discharges the capacitor device according to the output (charge pump current) of the charge pump 52. In other words, the loop filter 53 converts the charge pump current generated by the charge pump 52 into a control voltage Vc. The VCO 54 outputs the second clock CLK2 with a frequency corresponding to the control voltage Vc that is input from the loop filter 53. The frequency divider 55 divides the input second clock CLK2 by 1/N (here, N is a natural number) and inputs a divided feedback clock FOLK to the frequency comparator 51.

According to such an operation, the PLL 50 outputs the second clock CLK2 of the frequency f0 that is acquired by multiplying the input clock RCLK by N.

The CDR 40 (first PLL circuit) employs a PLL system and includes a phase comparator 41, a charge pump 42, a loop filter 43, and a VCO 44.

The phase comparator 41 compares the phase of the reception data RDT with the phase of the first clock CLK1 fed back from the VCO 44 and generates two control pulse signals (an up signal and a down signal) corresponding to a phase difference thereof. In a case where the phase of the reception data RDT leads the phase of the fed back first clock CLK1, the up signal is output to the charge pump 42. On the other hand, in a case where the phase of the reception data RDT lags the phase of the first clock CLK1, the down signal is output to the charge pump 42. The phase comparator 41 activates the up signal or the down signal only for a time that is proportional to the detected phase difference. In addition to the phase difference between the reception data RDT and the first clock CLK1, the phase comparator 41 also detects a frequency difference.

The phase comparator 41 outputs, to the application timing generator 61, a state signal ST1, which is in the On state during a period from the start of reception of the data RDT to the end of the reception of the data RDT and is in the Off state during a period in which the data RDT is not received. For example, the phase comparator 41 detects the start of reception of the data RDT by determining the start of a packet RDT and detects the end of the reception of the data RDT by determining the end of the packet RDT.

The charge pump 42 converts the two control pulse signals (the up signal and the down signal) output from the phase comparator 41 into analog signal and outputs the converted analog signal to the loop filter 43. In other words, the charge pump 42 generates a charge pump current corresponding to a phase difference that is the output of the phase comparator 41. The loop filter 43 includes a capacitor device and charges or discharges the capacitor device according to the output (charge pump current) of the charge pump 42. The VCO 44 outputs the first clock CLK1 with a frequency corresponding to the control voltage Vd that is input from the loop filter 43. According to such an operation, the CDR 40 extracts the first clock CLK1 of the frequency f0 from the received data RDT.

When the CDR 40 is in a standby state, only the phase comparator 41 is in an operable state, and the other constituent components that are the charge pump 42, the loop filter 43, and the VCO 44 are in an operation stopped state. Here, the operation stopped state is a state having power consumption lower than that of the normal state, and, in that state, the power may be cut off, or the enable terminal of each circuit may be in the Off state. This control process is performed by the application timing generator 61 to be described later.

Here, in a case where the bit rate of data transmission is about 1 Gbps, the CDR 40 may be configured using an over sampling system. In the over sampling system, a built-in clock having a frequency that is several times of the bit rate of the reception data RDT is generated by multiplying a parallel running clock RCLK. By using this built-in clock, the first clock CLK1 having the same frequency as the bit rate of the reception data is generated. However, as the bit rate of data increases, it is difficult to generate a built-in clock used for over sampling due to a power restriction and the like.

Figure 2:
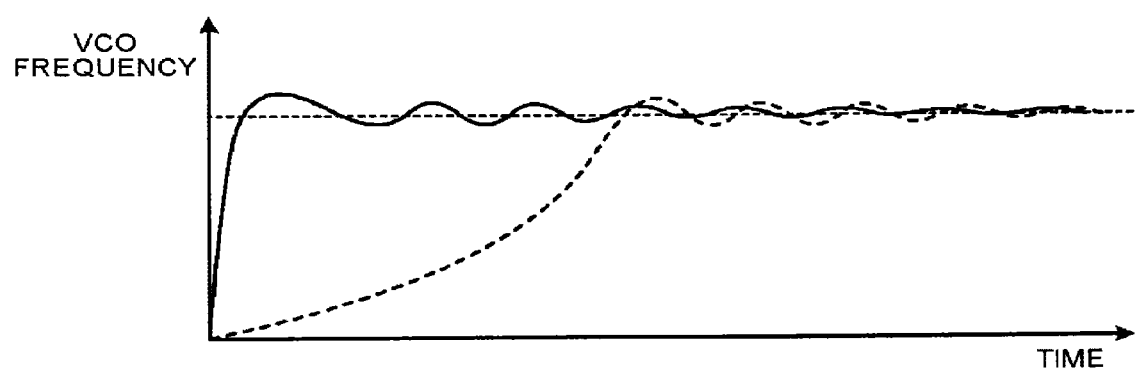
FIG. 2 is a timing diagram of VCO frequencies of receiving devices of a comparative example and the first embodiment.

Accordingly, in this embodiment, the CDR 40 using a PLL system is adopted. However, according to the CDR using the PLL system, as denoted by a broken line in FIG. 2, when the CDR 40 starts to operate, a lockup time until establishing phase synchronization is longer than that of the CDR using the over sampling system. In order to avoid this, there is a method in which fixed electric potential corresponding to an oscillation frequency is applied as a control voltage of the VCO arranged inside the CDR. In a system in which the bit rate of data is known, the electric potential to be applied is known, and the lockup time can be shortened. However, in a system in which the transmission bit rate of data is variable in a certain range, such a method cannot be used. For example, in the UHS-II specification of an SD card, the transmission bit rate of data is in a variable range of 790 Mbps to 1.56 Gbps.

Thus, in this embodiment, also in a system in which the bit rate of the data RDT is variable, an appropriate control voltage according to the bit rate of the data RDT is applied to the VCO 44 of the CDR 40. Accordingly, as denoted by a solid line FIG. 2, the lockup time of the CDR 40 is shortened.

The control voltage applying circuit 60 includes the application timing generator 61, and an output circuit 62. The application tinting generator 61 performs control of operating/stopping the CDR 40 based on the state signal ST1 that is input from the phase comparator 41. The application timing generator 61 starts the operation of the CDR 40 by causing the active signal EN1 to be in the On state at the time of starting reception of the data RDT when the state signal ST1 becomes On from the Off state. The application timing generator 61 stops the operation of the CDR 40 by causing an active signal EN1 to be in the Off state at the time of ending the reception of the data RDT when the state signal ST1 becomes Off from the On state. Accordingly, the CDR 40 in the operating state at the time of receiving a packet, and the CDR 40 is in the standby state (stopped state) described above at the time of not receiving a packet.

In addition, the application timing generator 61 inputs a switch signal SW1 to the output circuit 62. The switch signal SW1 becomes On at a time at which the state signal ST1 becomes On from the Off state. The switch signal SW1 becomes Off when a predetermined time Ta set in advance elapses. The time Ta is set in consideration of the lockup time of the CDR 40.

The input of the output circuit 62 is connected to the output of the loop filter 53 of the PLL 50. The output of the output circuit 62 is connected to an input line 43L (the output line of the charge pump 42) of the loop filter 43. When the switch signal SW1 is in the On state, the output circuit 62 applies a control voltage (control signal) Vc, which is the output of the loop filter 53 of the PLL 50, to the input 43L of the loop filter 43. When the switch signal SW1 is in the Off state, the output circuit 62 does not apply the control voltage (control signal) Vc to the input 43L of the loop filter 43. In other words, when the switch signal SW1 is in the Off state, the output circuit 62 sets the output of the output circuit 62 to be in a high impedance state.

During the operation of the device 100, the control voltage applying circuit 60 is constantly operated regardless of the reception/no-reception of a packet.

As described above, during a period in which a packet RDT is not received, in the CDR 40, only the phase comparator 41 is in the operable state, and the other circuits stop the operations thereof. When the packet RDT is started to be received, the phase comparator 41 causes the state signal ST1 to be in the On from the Off state. When the state signal ST1 becomes On from the Off state, the application timing generator 61 causes the active signal EN1 to be in the On state, thereby starting to operate the charge pump 42, the loop filter 43, and the VCO 44 arranged inside the CDR 40. In addition, when the state signal ST1 becomes On from the Off state, the application timing generator 61 outputs the switch signal SW1, which is in the On state during the predetermined time Ta from this time point, to the output circuit 62. Accordingly, during the predetermined time Ta immediately after the CDR 40 receives the packet RDT and is started to operate, the output (control voltage Vd) of the loop filter 43 of the CDR 40 is determined according to the control voltage Vc that is the output of the loop filter 53 of the PLL 50. In other words, the control voltage Vd that is the output of the loop filter 43 is initially set to the control voltage Vc during the predetermined time to immediately after the start of the operation of the CDR 40. For this reason, during the time Ta immediately after the start of the operation of the CDR 40, the VCO 44 of the CDR 40 oscillates at a frequency according to the control voltage Vd=Vc. After the time Ta elapses, the VCO 44 of the CDR 40 oscillates under the control of the charge pump 42 as usual.

Figure 3:
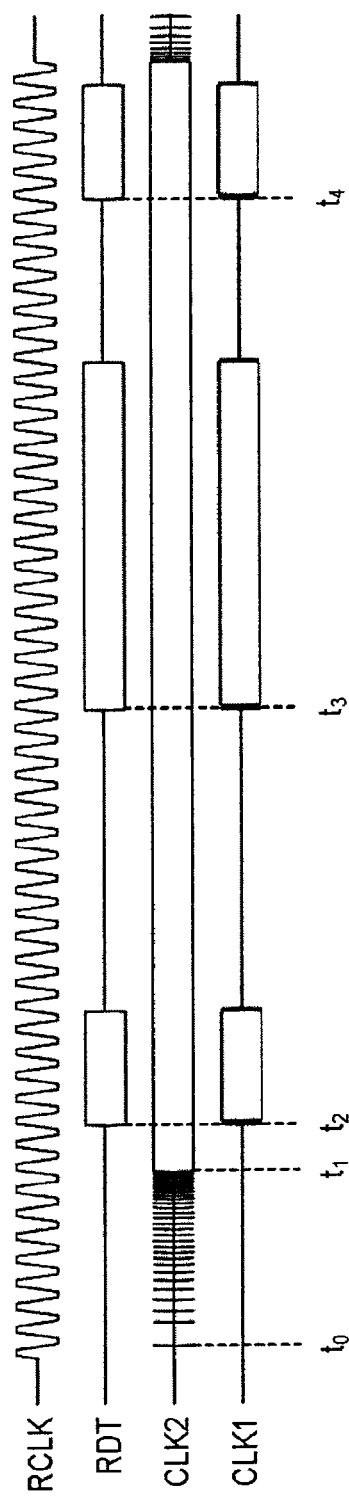
FIG. 3 is a timing diagram of major signals of the receiving device according to the first embodiment.

FIG. 3 illustrates a timing diagram of the reception clock RCLK, the reception data RDT, the first clock CLK1, and the second clock CLK2. In FIG. 3, regarding the first clock CLK1 and the second clock CLK2, a period from time t0 to time t1, between an extremely short period from time t2, between an extremely short period from time t3, and between an extremely short period from time t4 represent periods during which synchronization is not established, and white periods represent periods during which synchronization is established. As described above, before starting to transmit the packet RDT, the host 1 starts to transmit the clock RCLK. When the clock RCLK is received, the PLL 50 of the receiving device 10 starts a PLL operation for multiplying the clock RCLK by N (time t0). After passing through a relatively long lockup time, the PILL 50 is synchronized (time t1). At the time t1 when the synchronization of the PLL 50 is established, the CDR 40 does not receive the packet RDT and is not started to operate. In other words, thereafter, in a case where the CDR 40 is started to operate, the synchronization of the PLL 50 has already been established, and the VCO 54 of the DLL 50 stably oscillates.

Here, the frequency f0 of the second clock CLK2 output by the PLL 50 and the frequency f0 of the first clock CLK1 output by the CDR 40 are the same. For this reason, the control voltage Vc used for causing the VCO 54 of the PLL 50 to oscillate at the frequency f0 and the control voltage Vd used for causing the VCO 44 of the CDR 40 to oscillate at the frequency f0 have the same value.

Thus, in this embodiment, by comprising the control voltage applying circuit 60, until the predetermined time Ta elapses immediately after the start of the operation of the CDR 40, the control voltage Vc of the VCO 54 of the PLL 50 that has stably oscillated is applied as the initial control voltage of the VCO 44 of the CDR 40. For this reason, as illustrated at time points t2, t3, and t4, when the operation of the CDR 40 is started, the CDR 40 an establish a synchronized state at a high speed.

Here, the output of the control voltage applying circuit 60 may be configured to be directly connected to the input of the VCO 44.

In this way, according to the first embodiment, during the predetermined time Ta immediately after the start of the operation of the CDR 40, the control voltage Vc of the VCO 54 arranged inside the PLL 50 is applied as the initial control voltage of the VCO 44 arranged inside the CDR 40. For this reason, also in a system in which the bit rate of the data RDT is variable, a time required for establishing the synchronization of the CDR 40 can be markedly shortened. Accordingly, also when a system in which power consumption is reduced by causing the CDR 40 to be in the standby state at the time of no transmission of a packet is employed, the reception of a packet can be started within a short time. Thus, power consumption reduction and high-speed start of the reception can be realized.

(Second Embodiment)

According to a second embodiment, voltage application from a control voltage applying circuit 60 to a CDR 40 is stopped in a stepped manner. More specifically, by controlling the output impedance of an output circuit 62, the impedance is increased in a stepped manner from a state of being ideally seen as a voltage source of zero ohms, finally, a high impedance state is formed, and voltage application is stopped.

Figure 4:
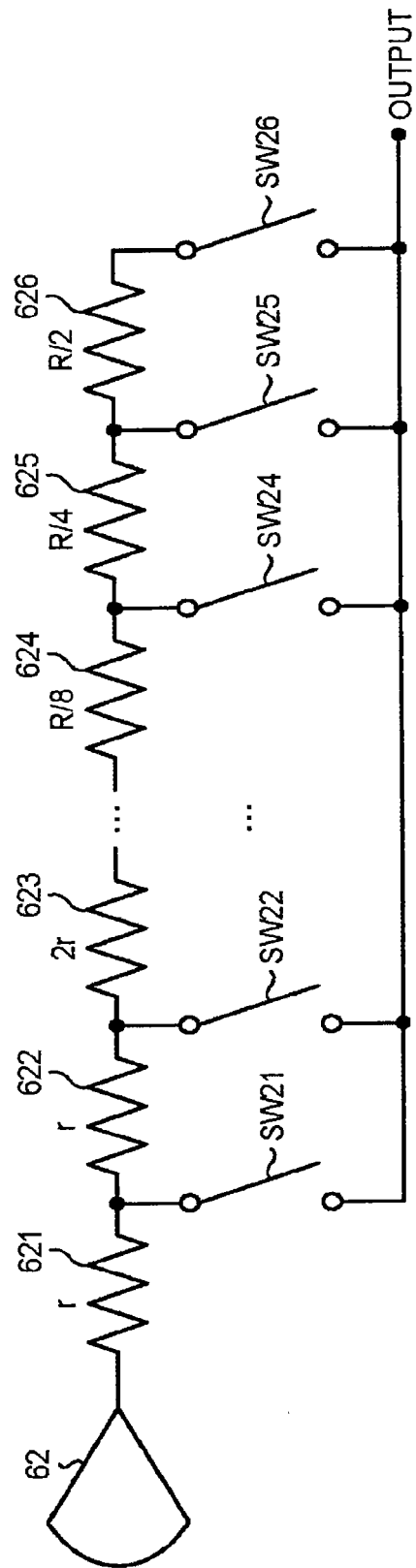
FIG. 4 is a diagram that illustrates an example of the circuit configuration of an output unit of an output circuit.

FIG. 4 illustrates an example of a circuit according to a second embodiment. On the output side of an output circuit 62, a plurality of resistors 621 to 626 and a plurality of switches SW21 to SW26 are arranged. The switches SW21 to SW26 are controlled to be turned on/off by an application timing generator 61. The resistance values of the resistors 622 to 626 are increased in power of 2 in order of the resistors 622, 623, . . . The resistor 621 includes the output impedance of the output circuit 62 itself. The output impedance of the output circuit 62 is r when the all the switches SW21 to SW26 are turned on. When the switches are sequentially turned off in order of the switches SW121, SW22, SW24, SW25, and SW26, the output impedance of the output circuit 62 is sequentially doubled. In addition, when only the switch SW26 is turned on, the output impedance of the output circuit 62 is R. Furthermore, when all the switches SW21 to SW26 are turned off, the output impedance of the output circuit 62 is in the high impedance state.

As above, according to the second embodiment, by increasing the output impedance of the output circuit 62 in a stepped manner, an inflow current flowing from a charge pump 42 of a CDR 40 and an inflow current flowing from the output circuit 62 can smoothly overlap each other, and accordingly, an overshoot of a loop filter voltage (control voltage Vd) can be alleviated.

(Third Embodiment)

Figure 5:
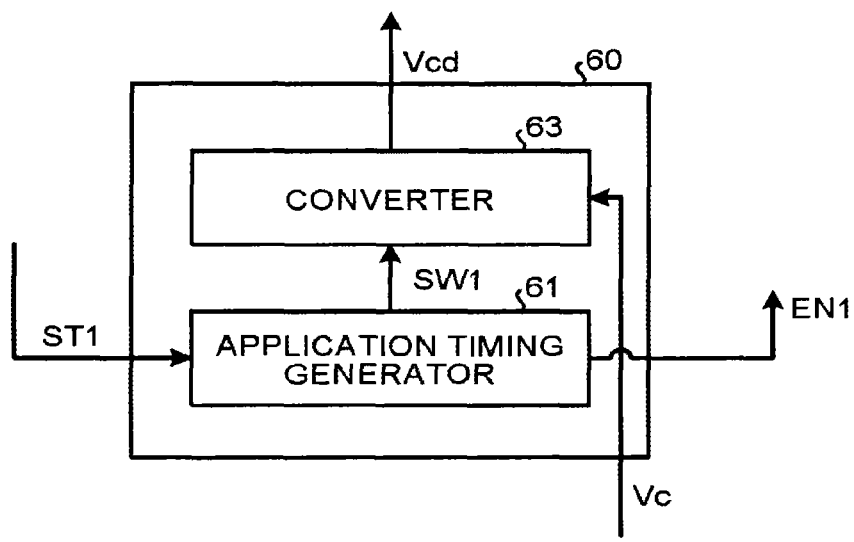
FIG. 5 is a block diagram that illustrates an example of the internal configuration of a control voltage applying circuit according to a second embodiment.

FIG. 5 illustrates an example of the internal configuration of a control voltage applying circuit 60 according to a third embodiment. In the third embodiment, a case is assumed in which a VCO 44 arranged inside a CDR 40 and a VCO 54 arranged inside a PLL 50 have mutually-different voltage-frequency characteristics (V-F characteristics). A control voltage applying circuit 60 according to the third embodiment includes an application timing generator 61 and a converter 63. The application timing generator 61, similar to the first embodiment, outputs a switch signal SW1 that becomes ON at a time point of the reception of a packet (reception data) RDT and becomes Off according to an elapse of a predetermined time Ta after that. In addition, the application timing generator 61 outputs the active signal EN1 described above.

The V-F characteristic (V1-F1 characteristic) of the VCO 54 arranged inside the PLL 50 is represented in the following Equation (1).

$$F1 = \alpha 1 \cdot V1 + \beta 1 \quad (1)$$

In addition, the V-F characteristic (V2-F2 characteristic) of a VCO 44 arranged inside the CDR 40 is represented in the following Equation (2).

$$F2 = \alpha 2 \cdot V2 + \beta 2 \quad (2)$$

Figure 6:
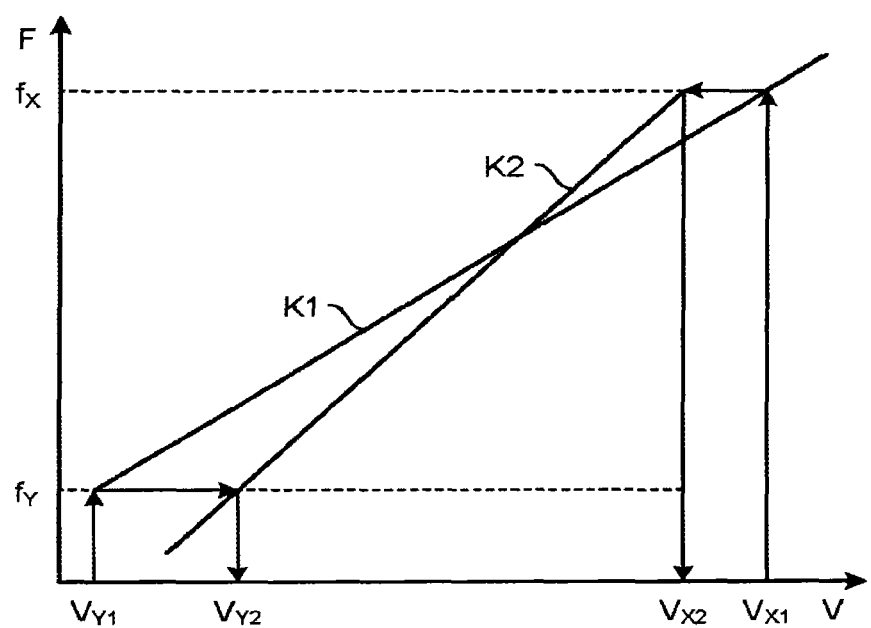
FIG. 6 is a diagram that illustrates V-F characteristics of a VCO of a CDR and V-F characteristics of a VCO of a PLL.

In FIG. 6, K1 represents the V-F characteristic of the VCO 54 arranged inside the PLL 50, and K2 represents the V-F characteristic of the VCO 44 arranged inside the CDR 40.

A conversion equation from V1 to V2 is as represented in the following Equation (3).

$$V2 = a \cdot V1 + b \quad (3)$$

(here, $a = \alpha 1/\alpha 2$, and $b = (\beta 1 - \beta 2)/\alpha 2$)

Figure 7:
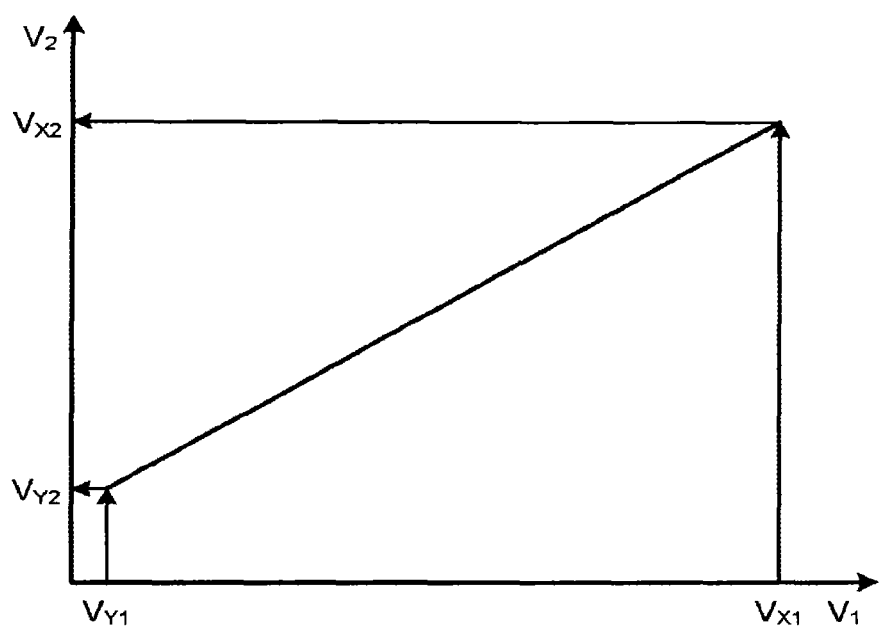
FIG. 7 is a diagram that illustrates conversion characteristics of a converter.

FIG. 7 illustrates a conversion characteristic from V1 to V2. In Equation (3), a parameter a is a conversion gain, and a parameter b is an offset that is a difference between oscillation frequencies. The converter 63 converts a control voltage Vc output from a loop filter 53 of the PLL 50 into a control voltage Vcd by using Equation (3) described above and applies the converted control voltage Vcd to an input line 43L of a charge pump 42 or the input of the VCO 44 during a period in which the switch signal SW1 is in the On state.

In the description presented above, while the converter 63 performs a linear conversion, the converter 63 may perform a non-linear conversion according to the V-F characteristic of the VCO 54 arranged inside the PLL 50 and the V-F characteristic of the VCO 44 arranged inside the CDR 40. In addition, as described in the second embodiment, the output impedance control circuit described in the second embodiment may be provided in an output unit of the converter 63.

As above, according to the third embodiment, the control voltage Vc is converted according to the V-F characteristic of the VCO 54 arranged inside the PLL 50 and the V-F characteristic of the VCO 44 arranged inside the CDR 40, and the control voltage Vcd acquired after the conversion is applied to the CDR 40 as the initial voltage. Accordingly, phase synchronization can be established in a shorter time in the CDR 40.

(Fourth Embodiment)

Figure 8:
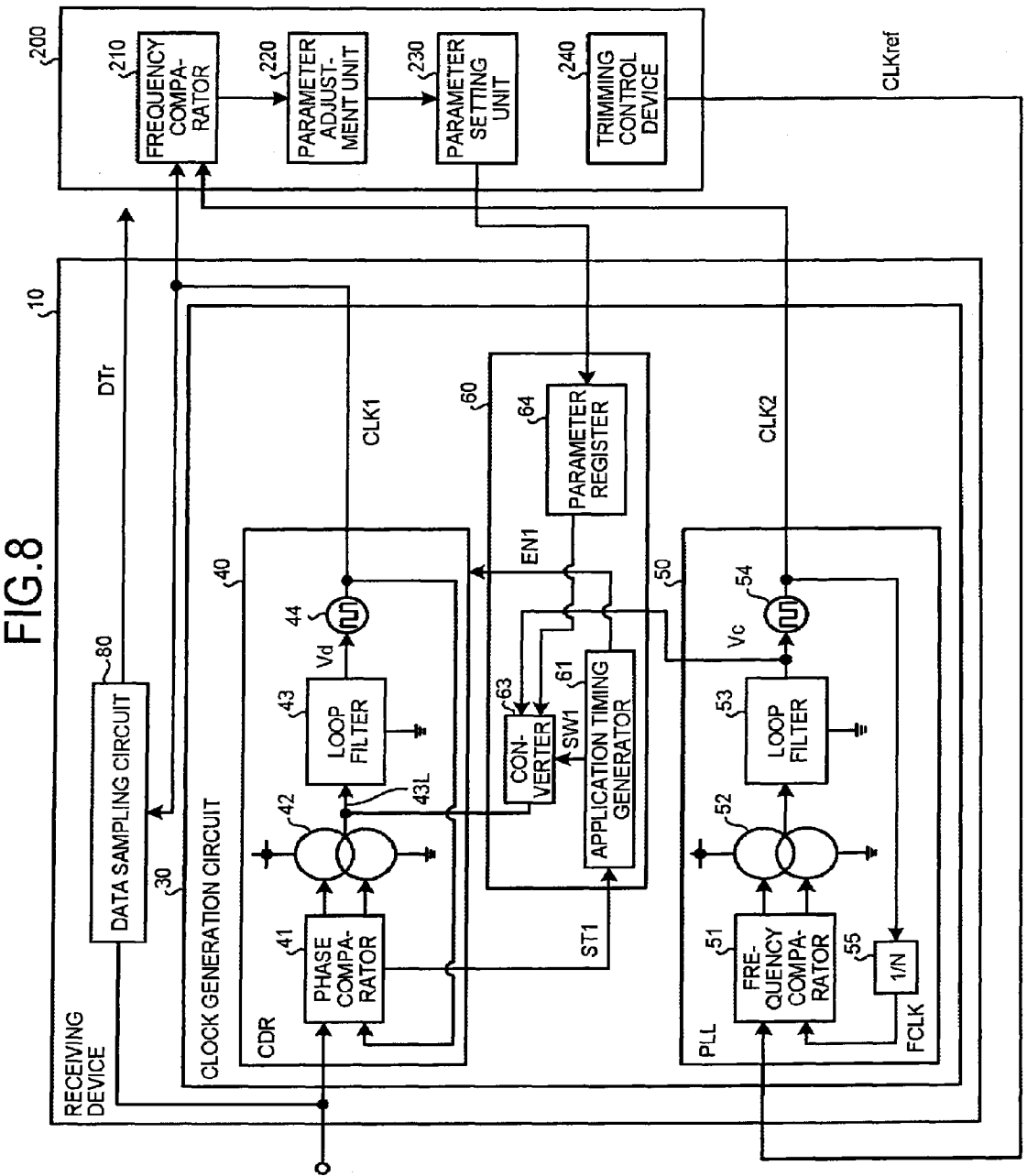
FIG. 8 is a diagram that illustrates an example of the system configuration illustrating a fourth embodiment.

In a fourth embodiment, an example of the configuration for trimming parameters a and b of a converter 63 at the time of manufacturing a receiving device 10 will be described. FIG. 8 illustrates the receiving device 10 to which a trimming device 200 is connected.

A control voltage applying circuit 60 includes: an application timing generator 61; a converter 63; and a parameter register 64. The parameter register 64 is a nonvolatile memory, and a conversion gain a and a slice constant b as the parameters described in the third embodiment are set therein. The converter 63 performs a conversion operation represented in Equation (3) by using the parameters a and b set in the parameter register 64.

The trimming device 200 includes: a frequency comparator 210; a parameter adjustment unit 220; a parameter setting unit 230; and a trimming control device 240. A first clock CLK1 output from a CDR 40 and a second clock CLK2 output from a PLL 50 are input to the frequency comparator 210.

When a trimming operation is performed, in accordance with an instruction from the trimming control device 240, the operations of a phase comparator 41 and a charge pump 42 of the CDR 40 are stopped, and a reference clock CLKref is input to the input of a frequency comparator 51 of the PLL 50. The frequency of the reference clock CLKref is set to the same frequency f0/N as that of the clock RCLK input from the transmitting device side. By operating the PLL 50, a VCO 54 generates a control voltage Vc oscillating at the frequency f0 from a loop filter 53. The control voltage Vc is applied to the CDR 40 through the converter 63. A VCO 44 of the CDR 40 is controlled according to only the control voltage output by the converter 63. In addition, under the control of the trimming control device 240, the application timing generator 61 constantly sets a switch signal SW1 to be in the On state during the trimming operation.

The frequency comparator 210 detects a frequency difference between the first clock CLK1 and the second clock CLK2 and inputs the frequency difference to the parameter adjustment unit 220. The parameter adjustment unit 220 adjusts the parameters a and h according to the frequency difference and inputs the adjusted parameters a and b to the parameter setting unit 230. The parameter setting unit 230 sets the input parameters a and b in the parameter register 64. The parameter adjustment unit 220 repeats the adjustment and the resetting of the parameters a and b until the frequency difference becomes zero.

In the trimming control device 240, a plurality of different frequencies are set within the variable range of the transmission hit rate of data RDT that is input to the receiving device 10. The trimming control device 240 selects one of a plurality of frequencies as the frequency of the reference clock CLKref and inputs a reference clock CLKref having the selected frequency, thereby performing the above-described trimming operation. Next, the trimming control device 240 changes the frequency of the reference clock CLKref and performs the same trimming operation. In this way, the same trimming operation is performed using the reference clock CLKref having a plurality of frequencies, parameters a and b that are optimal to the plurality of frequencies are selected, and the selected parameters a and b are set in the parameter register 64.

In addition, it may be configured such that the trimming device 200 is built in the receiving device 10, and the trimming operation is performed every time when the receiving device 10 is started to operate.

In this way, according to the fourth embodiment, a voltage converting operation of the converter 63 can be performed by using the optimal parameters.

(Fifth Embodiment)

In a fifth embodiment, until reception of a packet ends from a time point at which synchronization of the CDR 40 is established, a PLL 50 is configured to be in a standby state. During the standby state, a frequency comparator 51, a charge pump 52, a loop filter 53, a VCO 54, and a frequency divider 55 arranged inside the PLL 50 are in the operation stopped state. Here, the operation stopped state is a state having power consumption lower than that of the normal state, and, in that state, the power may be cut off, or the enable terminal of each circuit may be in the Off state. This control process is performed by an application timing generator 61.

Figure 9:
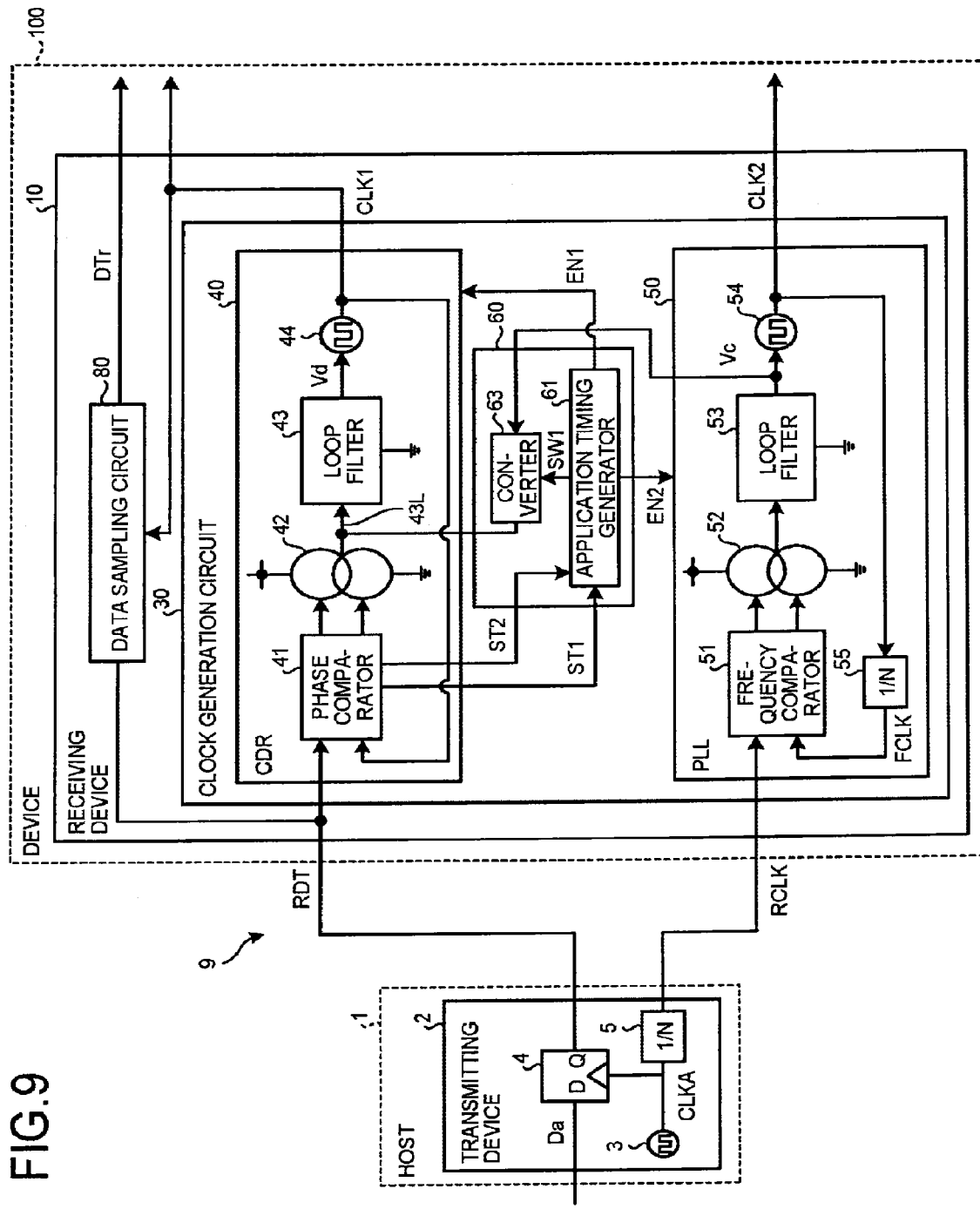
FIG. 9 is a block diagram that illustrates an example of the internal configuration of a receiving device according to a fifth embodiment.

FIG. 9 illustrates an example of the configuration of a receiving device 10 according to the fifth embodiment. A phase comparator 41 detects a timing at which synchronization of the CDR is established and outputs a state signal ST2, which becomes On at a time point at which the phase synchronization of the CDR 40 is established, to an application timing generator 61. For example, the state signal ST2 is a one-shot pulse signal that becomes On at the time point at which synchronization of the CDR 40 is established. The application timing generator 61 outputs an active signal EN2 used for controlling the operating state of the PLL 50 to the PLL 50. In the example illustrated in FIG. 9, the other configurations are similar to those of the receiving devices 10 described in the first embodiment and the third embodiment.

Figure 10:
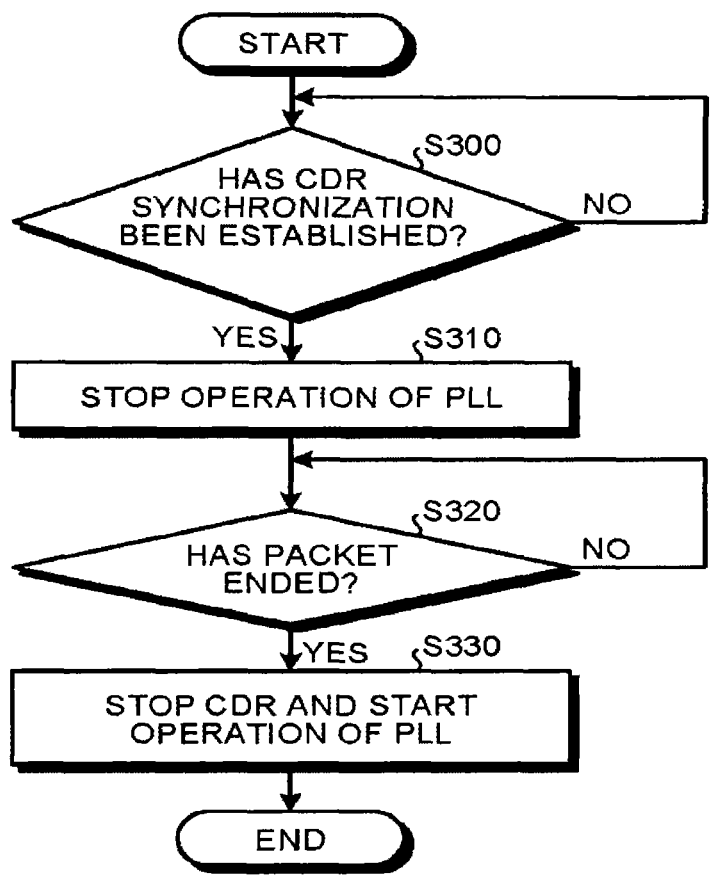
FIG. 10 is a flowchart that illustrates an example of the operation of the receiving device according to the fifth embodiment.

FIG. 10 is a flowchart that illustrates the operation sequence of the receiving device 10 according to the fifth embodiment. As described above, immediately after the start of reception of a packet RDT, the CDR 40 is started to operate, and, during a predetermined time Ta from the start of the reception of the packet RDT, a control voltage Vc of a VCO 54 arranged inside the PLL 50 is applied to the CDR 40. When the establishment of synchronization of the CDR 40 is detected, the phase comparator 41 outputs a state signal ST2 to the application timing generator 61. When the state signal ST2 is detected (Step S300), the application timing generator 61 sets the active signal EN2 to be in the Off state and stops the operation of the PLL 50 (Step S310). All the constituent components of the PLL 50 that are the frequency comparator 51, the charge pump 52, the loop filter 53, the VCO 54, and the frequency divider 55 are in the standby state.

Thereafter, when the end of the reception of the packet RDT is detected as the state signal ST1 becomes Off from the On state (Step S320), the application timing generator 61 stops the CDR 40 by setting the active signal EN1 to be in the Off state and restarts the PLL 50 by setting the active signal EN2 to be in the On state (Step S330).

As above, according to the fifth embodiment, the operation of the PLL 50 is stopped until the end of reception of a packet after the establishment of synchronization of the CDR 40, and, when the reception of the packet ends, the PLL 50 is restarted. For this reason, the power consumption is reduced, and it is possible to prepare for the start of the operation of the CDR 40 at the time of reception of a next packet.

(Sixth Embodiment)

In a sixth embodiment, after the establishment of synchronization of a CDR 40, the operation of a PLL 50 is continued. In other words, according to the sixth embodiment, an application timing generator 61 does not set the PLL 50 to be in the standby state. However, after the establishment of synchronization of the CDR 40, by using a circuit illustrated in FIG. 4, the voltage application to the CDR 40 is continuously performed by setting the output impedance of the output circuit 62 according to the first embodiment or the converter 63 according to the second embodiment to be in a middle impedance state. Here, the middle impedance is impedance that is higher than impedance ideally seen as a voltage source of zero ohms and is lower than the high impedance. In order to reduce the power consumption, the middle impedance is preferably impedance that is slightly lower than the high impedance.

In the case illustrated in FIG. 9, when a state signal ST2 representing the end of the establishment of synchronization is input from a phase comparator 41, an application timing generator 61 sets the output impedance of the converter 63 to be in the middle impedance state. Thereafter, also when the start of reception of a packet is further detected based on the state signal ST1, the application timing generator 61 continues to maintain the middle impedance state.

As above, according to the sixth embodiment, also after the synchronization of the CDR 40 is established, the operation of the PLL 50 is continued, and the control voltage Vc of the PLL 50 is applied to the CDR 40 in the middle impedance state. Accordingly, the power consumption is reduced, and, when a packet is started to be received, the synchronization of the CDR 40 can be established in a short time at the time of starting to receive a packet.

(Seventh Embodiment)

In a seventh embodiment, similar to the sixth embodiment, also after the synchronization of a CDR 40 is established, the operation of a PLL 50 is continued. However, in the seventh embodiment, during a period in which the reception of a packet ends after the synchronization of the CDR 40 is established, by using the circuit illustrated in FIG. 4, the voltage application to the CDR 40 is stopped by setting the output impedance of the output circuit 62 according to the first embodiment or the converter 63 according to the second embodiment to be the high impedance. In addition, during a period until a time point at which the synchronization for a next packet is established after the end of the reception of a packet, by using the circuit illustrated in FIG. 4, a voltage is applied to the CDR 40 by setting the output impedance of the output circuit 62 according to the first embodiment or the converter 63 according to the second embodiment to be in the middle impedance state. Thereafter, the high impedance state and the middle impedance state are repeated.

In the case illustrated in FIG. 9, when a state signal ST2 representing the end of the establishment of synchronization is input from a phase comparator 41, the application timing generator 61 sets the output impedance of the converter 63 to be the high impedance. When the end of reception of a packet is detected based on the state signal ST1, the application timing generator 61 continues to maintain this high impedance state. When the end of the reception of the packet is detected based on the state signal ST1, the application timing generator 61 sets the output impedance of the converter 63 to be the middle impedance. The application timing generator 61 continues to maintain this middle impedance state until establishment of synchronization of a next packet is detected based on the state signal ST2. When the establishment of synchronization of the next packet is detected based on the state signal ST2, the application timing generator 61 sets the output impedance of the converter 63 to be the high impedance. Thereafter, the application timing generator 61 repeats such a control process.

As above, according to the seventh embodiment, also after the synchronization of the CDR 40 is established, the operation of the PLL 50 is continued, and the control voltage Vc of the PLL 50 is applied to the CDR 40 in a state close to the high impedance state. Accordingly, the power consumption is reduced, and, when a packet is started to be received, the synchronization of the CDR 40 can be established in a short time at the time of starting to receive a packet.

(Eighth Embodiment)

In an eighth embodiment, similar to the sixth or seventh embodiment, also after the synchronization of a CDR 40 is established, the operation of a PLL 50 is continued. However, in the eighth embodiment, during a period in which the reception of a next packet is started after the establishment of synchronization of the current packet, by using the circuit illustrated in FIG. 4, the voltage is applied to the CDR 40 by setting the output impedance of the output circuit 62 according to the first embodiment or the converter 63 according to the second embodiment to be in the middle impedance state.

In the case illustrated in FIG. 9, when a state signal ST2 representing the end of the establishment of synchronization is input from a phase comparator 41, the application timing generator 61 sets the output impedance of the converter 63 to be in the middle impedance state. This state is On when a state signal ST1 input from the phase comparator 41 becomes Off and ends at a time point at which the start of reception of a next packet is recognized. At a time point at which the start of reception of a next packet is recognized, the application timing generator 61 decreases the output impedance of the converter 63 to a state of being ideally seen as a voltage source of zero ohms. Accordingly, when the reception of a next packet is started, the control voltage Vc of the PLL 50 is applied to the CDR 40 through low impedance.

As above, in the eight embodiment, also after the synchronization of the CDR 40 is established, the operation of the PLL 50 is continued, and the control voltage Vc of the PLL 50 is applied to the CDR 40 in a state close to the high impedance state. Accordingly, the power consumption is reduced, and, when a packet is started to be received, the synchronization of the CDR 40 can be established in a short time at the time of starting to receive a packet.

(Ninth Embodiment)

in a ninth embodiment, a configuration is added in which a PLL 50 refers to a control voltage of a VCO 44 of a CDR 40 as well. In the ninth embodiment, when the PLL 50 is restarted, the control voltage of the VCO 44 of the CDR 40 can be referred to. According to the ninth embodiment, similar to the fifth embodiment, until the reception of a packet ends after the establishment of synchronization of the CDR 40, the operation of the PLL 50 is stopped. In the ninth embodiment, when the PLL 50 is restarted at the time of ending the reception of the packet, a control voltage (control signal) Vd of the VCO 44 of the CDR 40 is applied as an initial voltage of the loop filter 53 of the PLL 50.

Figure 11:
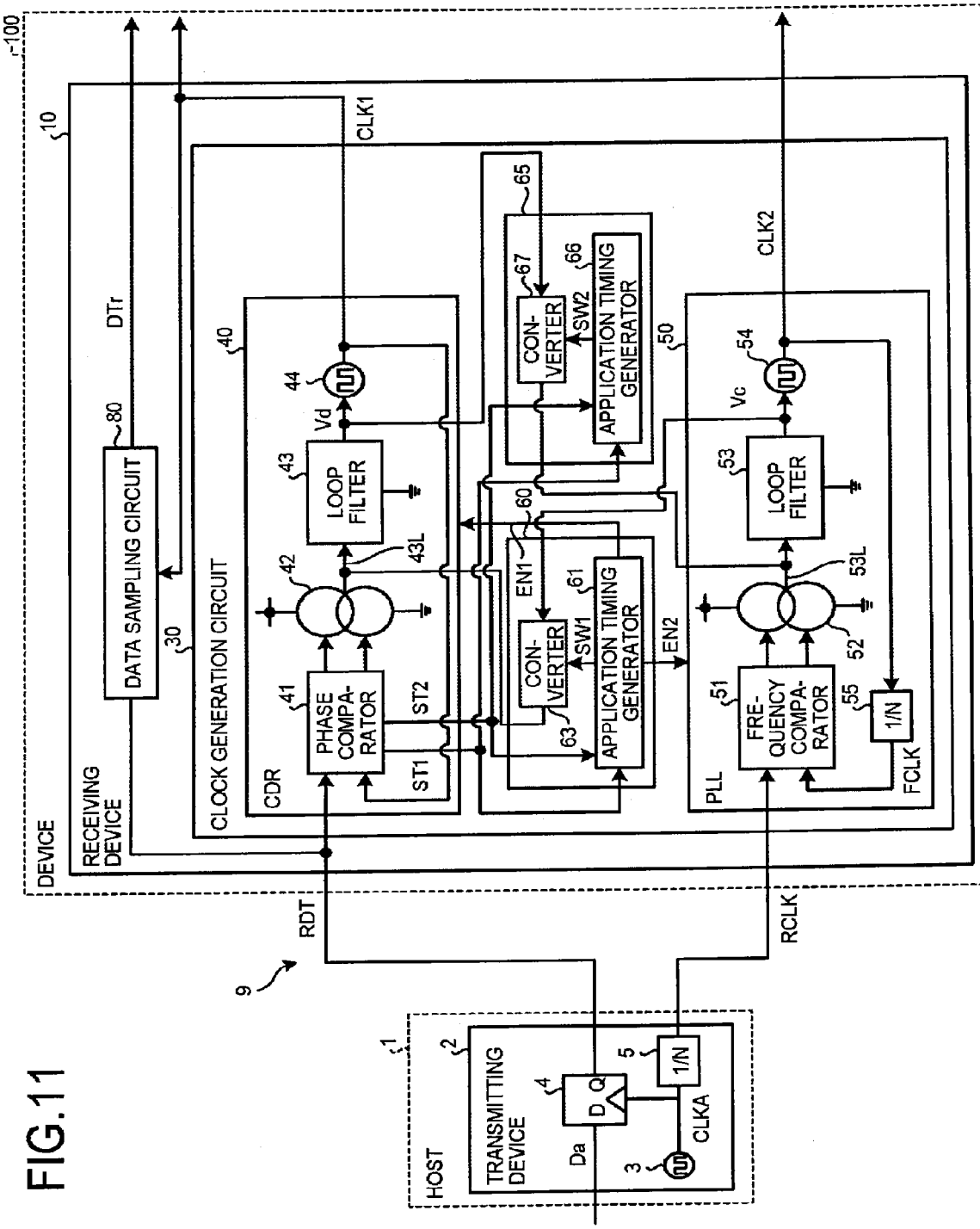
FIG. 11 is a block diagram that illustrates an example of the internal configuration of a receiving device according to a ninth embodiment.

FIG. 11 illustrates an example of the configuration of a receiving device 10 according to the ninth embodiment. The receiving device 10, in addition to the CDR 40, the PLL 50, and a first control voltage applying circuit 60, includes a second control voltage applying circuit 65. The first control voltage applying circuit 60 includes an application timing generator 61 and a converter 63.

The second control voltage applying circuit 65 includes an application timing generator 66 and a converter 67. A state signal ST1 of a phase comparator 41 is input to the application timing generator 66. The state signal ST1, as described above, becomes On during a period from the start of reception of data RDT to the end of the reception and becomes Off during a period in which the data RDT is not received. The application timing generator 66 inputs a switch signal SW2, which becomes On at a time point at which the state signal ST1 becomes Off from the On state and becomes Off when a predetermined time Tb set in advance elapses, to the converter 67. Here, the time Tb is set in consideration of the lockup time of the PLL 50.

The converter 67 converts the control voltage Vd output from a loop filter 43 of the CDR 40, as described above, based on the characteristics of the VCO 44 and a VCO 54. The input of the converter 67 is connected to output of the loop filter 43 of the CDR 40, and the output of the converter 67 is connected to an input line (an output line of the charge pump 52) 53L of the loop filter 53. When the switch signal SW2 is in the On state, the converter 67 applies a control voltage Vd that is the output of the loop filter 43 of the CDR 42 to the input 53L of the loop filter 53. On the other hand, when the switch signal SW2 is in the Off state, the converter 67 does not apply the control voltage Vd to the input 53L of the loop filter 53. In other words, when the switch signal SW2 is in the Off state, the converter 67 sets the output impedance of the converter 67 to the high impedance. As described in the second embodiment, the output impedance of the converter 67 may be increased up to the high impedance in a stepped manner.

Figure 12:
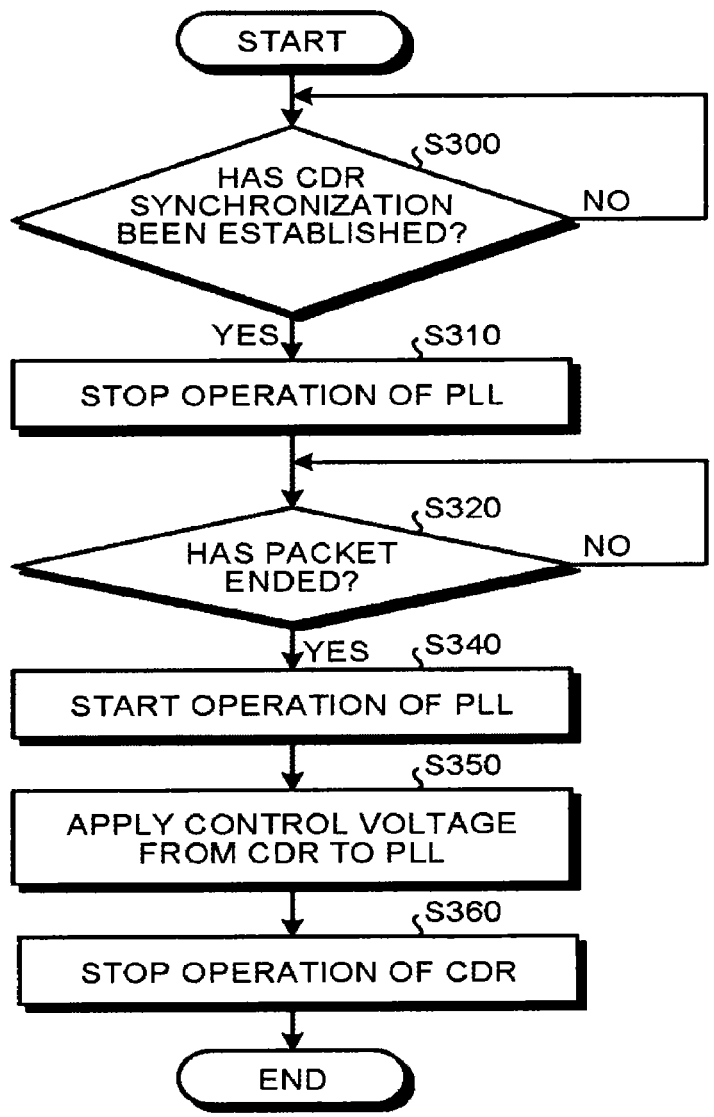
FIG. 12 is a flowchart that illustrates an example of the operation of the receiving device according to the ninth embodiment.

The operation of the receiving device 10 illustrated in FIG. 11 will be described along a flowchart illustrated in FIG. 12. As described above, immediately after the start of reception of a packet RDT, the CDR 40 is started to operate, and, during a predetermined time Ta after the start of the reception of the packet RDT, the control voltage Vc of the VCO 54 arranged inside the PLL 50 is applied to the CDR 40. When the establishment of synchronization of the CDR 40 is detected, the phase comparator 41 outputs a state signal ST2 to the application timing generator 61. When the state signal ST2 is detected (Step S300), the application timing generator 61 sets an active signal EN2 to be in the Off state, thereby stopping the operation of the PLL 50 (Step S310).

Thereafter, when the end of the reception of the packet RDT is detected as the state signal ST1 becomes Off from the On state (Step S320), the application timing generator 61 sets the active signal EN2 to be in the On state, thereby restarting the PLL 50 (Step S340). In addition, the application timing generator 66 inputs a switch signal SW2, which is in the On state until a predetermined time Tb elapses from a time point at which the state signal ST1 become Off from the On state, to the converter 67. In this way, the converter 67 applies the control voltage Vd that is the output of the loop filter 43 of the CDR 40 to the input 53L of the loop filter 53 of the PLL 50. For this reason, when the PLL 50 is started to operate, the PLL 50 can establish a synchronization state at a high-speed.

When the end of the reception of the packet RDT is detected as the state signal ST1 becomes Off from the On state, the application timing generator 61 sets the active signal EN1 to be in the Off state at a time point at which a predetermined overlapping time Tc elapses from the time point of the detection, thereby stopping the CDR 40. In addition, a relation of "Tb<Tc" is set, and, after the application period Tb of the control voltage Vd of the CDR 40 to the PLL 50 ends, the operation of the CDR 40 is stopped.

Figure 13:
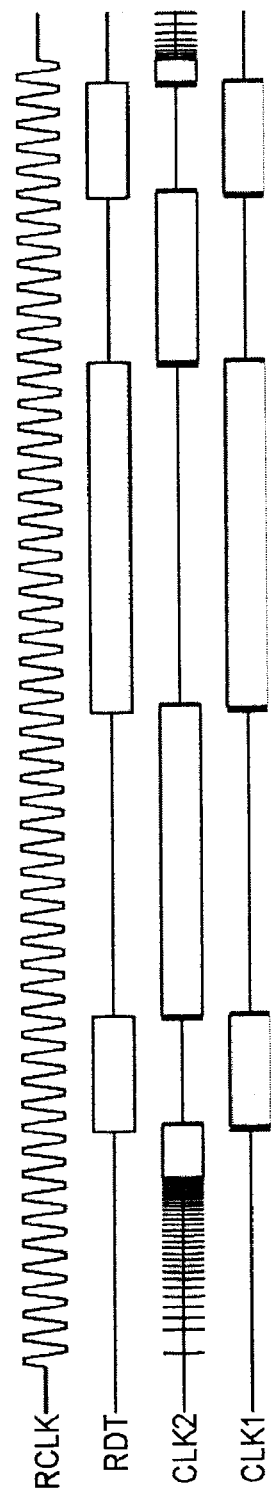
FIG. 13 is a timing diagram that illustrates an example of the operation of the receiving device according to the ninth embodiment.

FIG. 13 illustrates a timing diagram of major signals of the receiving device 10 according to the ninth embodiment. As illustrated in FIG. 13, the CDR 40 and the PLL 50 perform complementary operations except for a slight overlapping period in which one thereof is operated, but the other thereof is not operated. In addition, the output of the converter 67 may be configured to be directly connected to the input of the VCO 54.

As above, according to the ninth embodiment, the PLL 50 is started to operate by referring to the control voltage of the CDR 40, and, at the time of starting the operation of the PLL 50, the synchronization of the PLL 50 can be established in a short time.

In addition, in the ninth embodiment, it may configured such that, during a period in which operation of the CDR 40 is stopped, the control voltage Vc of the PLL 50 is applied to the CDR 40 by maintaining the output impedance of the converter 63 to the middle impedance, and, during a period in which the operation of the PLL 50 is stopped, the control voltage Vd of the CDR 40 is applied to the PLL 50 by maintaining the output impedance of the converter 67 to the middle impedance. In other words, the application timing generator 61 sets the active signal EN1 to be in the Off state and, during a period in which the operation of the CDR 40 is stopped, applies the control voltage Vc of the PLL 50 to the CDR 40 by maintaining the output impedance of the converter 63 to the middle impedance. In addition, the application timing generator 66, during a period (a period in which the active signal EN2 is in the Off state, and the operation of the PLL 50 is stopped) from a time when the state signal ST2 is input to a time point at which the state signal ST1 becomes Off from the On State, applies the control voltage Vd of the CDR 40 to the PLL 50 by maintaining the output impedance of the converter 67 to the middle impedance. Accordingly, when the PLL 50 or the CDR 40 is restarted, synchronization can be established in a short time.

(Tenth Embodiment)

Figure 14:
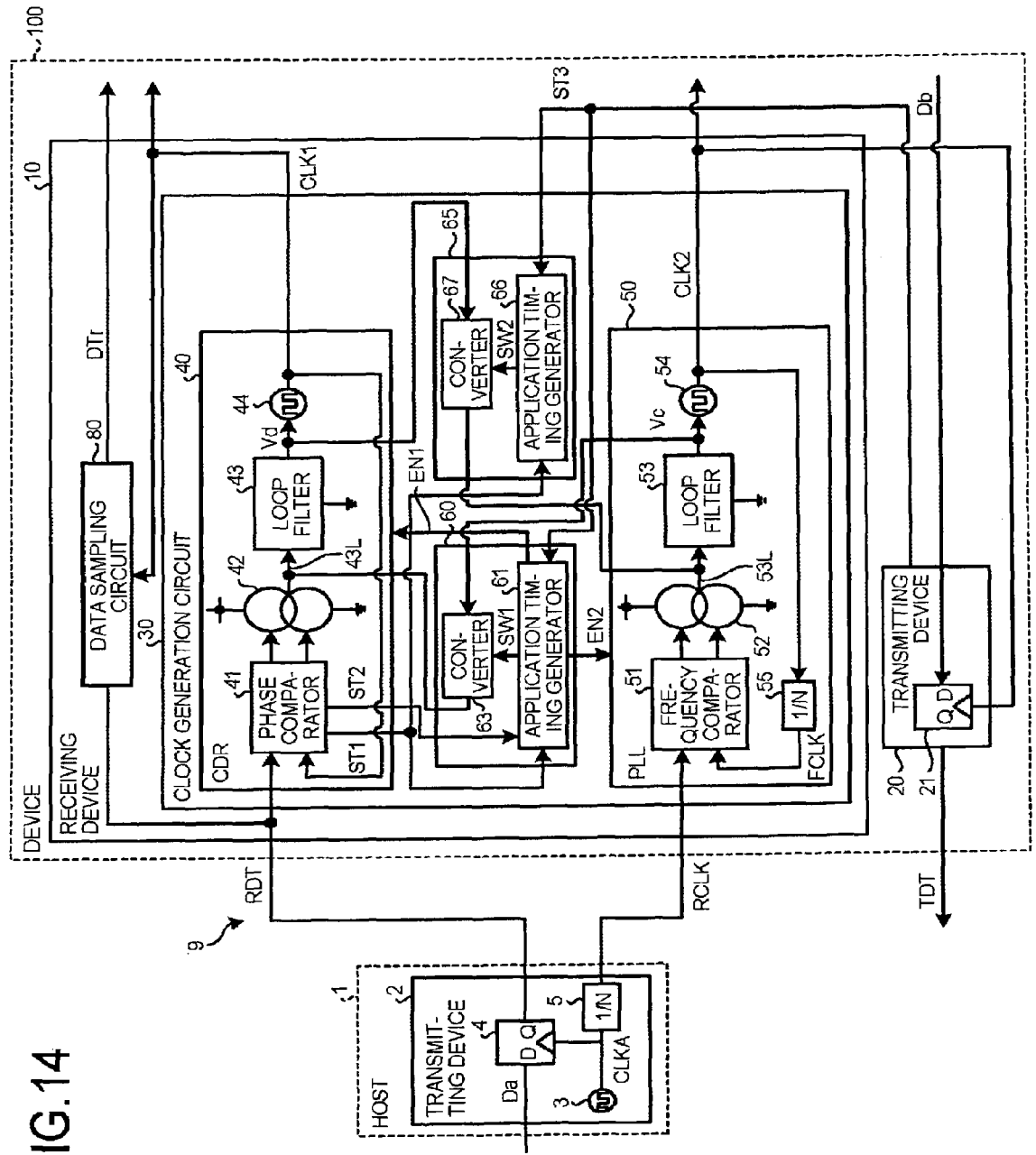
FIG. 14 is a block diagram that illustrates an example of the internal configuration of a receiving device according to a tenth embodiment.

According to a tenth embodiment, a device 100 can transmit and receive data. FIG. 14 illustrates an example of the configuration of the device 100 according to the tenth embodiment. A second clock CLK2 output from the PLL 50 is used as a clock for transmitting data. The device 100 include a transmitting device 20, and the transmitting device 20 includes a D-type flip-flop 21. The D-type flip-flop 21 latches input transmission data Db using the second clock CLK2 and transmits transmission data TDT synchronized with the second clock CLK2. In this way, the transmission data TDT of a frequency f0 is output from the device 100 to a host 1.

In the tenth embodiment, when data is transmitted, the second clock CLK2 of a PLL 50 is necessary. For this reason, the device 100 according to the tenth embodiment, during the reception of a packet RDT, also after the establishment of synchronization of the CDR 40, restart the operation of the PLL 50 when data is transmitted.

For this reason, in a case where the transmission data Db is received from the internal circuit of the device 100, the transmitting device 20 sets the state signal ST3 to be in the On state. The state signal ST3 is in the On state from the start of reception of the transmission data Db to the end of the reception. The transmitting device 20 inputs a state signal ST3 to an application timing generator 61 and an application timing generator 66. When the state signal ST3 becomes On from the Off state, the application timing generator 61 starts the operation of the PLL 50 by setting an active signal EN2 to be in the On state also during a period in which the CDR 40 is operated in a case where the operation of the PLL 50 is stopped.

In addition, the application timing generator 66 inputs a switch signal SW2, which becomes On from a time point at which the state signal ST3 becomes On and becomes Off when a predetermined time Tb set in advance elapses, the converter 67. Accordingly, the converter 67 applies a control voltage Vd that is the output of the loop filter 43 of the CDR 40 to the input 53l of the loop filter of the PLL 50. For this reason, at the time of starting the operation, the PLL 50 can establish a synchronized state at a high speed.

When the transmission of data ends, and the state signal ST3 become Off from the On state, the application timing generator 61 controls the stop of the PLL 50 according to the states of the state signals ST1 and ST2. For example, in a case where the packet RDT is received, and the synchronization of the CDR 40 is established, the operation of the PLL 50 is stopped, and the operating state of the PLL 50 is maintained during the other period.

Figure 15:
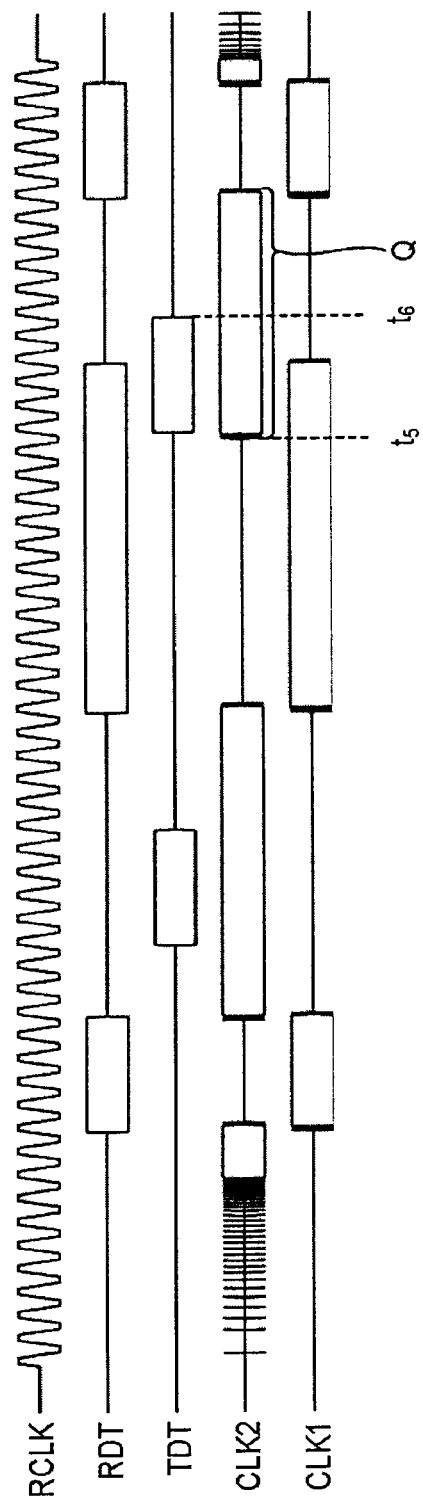
FIG. 15 is a timing diagram that illustrates an example of the operation of the receiving device according to the tenth embodiment.

FIG. 15 illustrates a timing diagram of major signals of the receiving device 10 according to the tenth embodiment. As illustrated in FIG. 15, at a start time point t5 of a period denoted by reference sign Q, it is in the state during reception of a packet RDT, the establishment of synchronization of the CDR 40 is completed. At this time point t5, the transmission of data is started. Accordingly, at the time point t5, the PLL 50 is started to operate. In addition, in this case, at the time of the end of the transmission (time point t6) corresponds to a period in which the packet RDT is not received, and accordingly, the PLL 50 is in the operated state also after that.

As above, according to the tenth embodiment, also when the PLL 50 is started to operate at the time of transmitting data, the PLL 50 is started to operate by referring to the control voltage of the CDR 40, and accordingly, the synchronization of the PLL 50 can be performed in a short time.

(Eleventh Embodiment)

Figure 16:
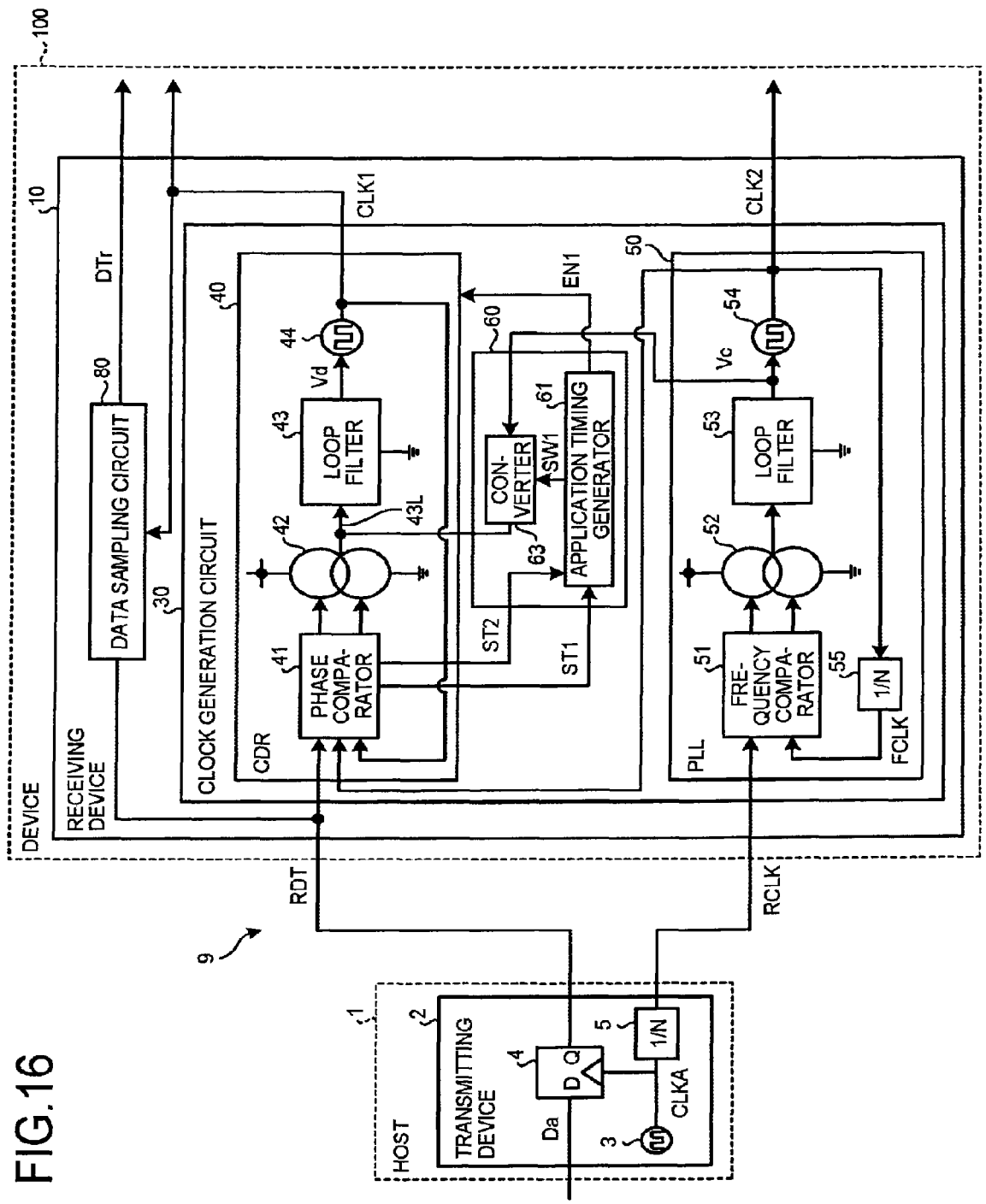
FIG. 16 is a block diagram that illustrates an example of the internal configuration of a receiving device according to an eleventh embodiment.

FIG. 16 illustrates an example of the configuration of a receiving device 10 according to an eleventh embodiment. In the eleventh embodiment, a second clock CLK2 that is output from a PLL 50 is input to a phase comparator 41 of a CDR 40. The phase comparator 41 selects the second clock CLK2 during a non-reception period of a packet RDT and selects a packet RDT during a reception period of the packet RDT. The phase comparator 41 compares the phase of the second clock CLK2 with the phase of a first clock CLK1 output from the CDR 40 during the non-reception period of the packet RDT. On the other hand, the phase comparator 41 compares the phase of the packet RDT with the phase of the first clock CLK1 output from the CDR 40 during reception period of the packet RDT.

At a time point at which the reception of the packet RDT is started, as described above, a control voltage is applied from the PLL 50 to the CDR 40 by a control voltage applying circuit 60.

In the previous embodiment, the CDR 40 cannot generate the first clock CLK1 during the non-reception period of the packet RDT. In the eleventh embodiment, also during the non-reception period of the packet RDT, the first clock CLK1 can be generated, and the transmission of the first clock CLK1 can be maintained.

In the first to eleventh embodiments described above, while the phase comparator 41 outputs the state signal ST1, the application timing generator 61 may be configured to detect the start of reception of the packet RDT, the end of reception of the packet RDT, and a time point of establishment of synchronization of the first clock CLK1.

(Twelfth Embodiment)

Figure 17:
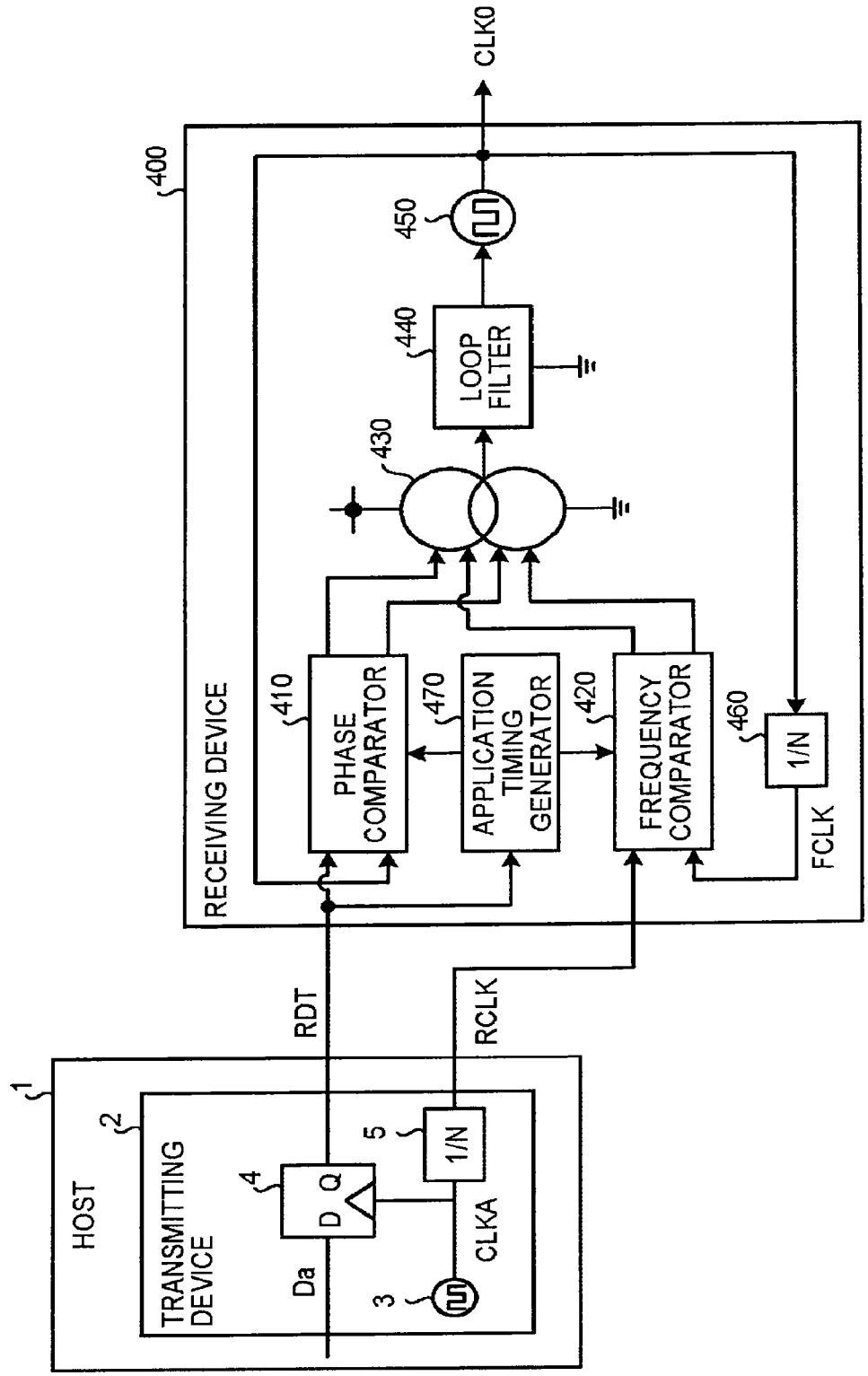
FIG. 17 is a block diagram that illustrates an example of the internal configuration of a receiving device according to a twelfth embodiment.

FIG. 17 illustrates a receiving device 400 according to a twelfth embodiment. This receiving device 400 includes: a phase comparator 410; a frequency comparator 420; a charge pump 430; a loop filter 440; a VCO 450; a frequency divider 460; and an application timing generator 470 as a control circuit. This receiving device 400 realizes the functions of the CDR 40 and the PLL 50 according to the above-described embodiment by sharing the charge pump 430, the loop filter 440, and the VCO 450. This receiving device 400 outputs one clock CLK0.

The phase comparator 410 compares the phase of reception data RDT received from a host 1 and the phase a clock CLK0 fed back from the VCO 450 and generates two control pulse signals (an up signal and a down signal) corresponding to the phase difference. The phase comparator 410 activates the up signal and the down signal only for a time that is proportional to the detected phase difference.

The frequency comparator 420 compares the frequency of a clock RCLK received from the host 1 and a feedback clock FCLK output from the frequency divider 460 and generates two control pulse signals an up signal and a down signal) corresponding to the frequency difference. The frequency comparator 420 activates the up signal and the down signal only for a time that is proportional to the detected frequency difference.

The charge pump 430 converts the two control pulse signals (the up signal and the down signal) output from one of the phase comparator 410 and the frequency comparator 420 into analog signal and outputs the converted analog signal to the loop filter 440. In her words, the charge pump 430 generates a charge pump current corresponding to a phase difference that is the output the phase comparator 410 or a frequency difference that is the output of the frequency comparator 420. The loop filter 440 includes a capacitor, and the capacitor is charged or discharged according to the output (charge pump current) of the charge pump 430. Inc VCO 450 outputs a clock CLK0 of a frequency according to the control voltage that is input from the loop filter 440. The frequency divider 460 divides the input clock CLK0 by 1/N (here, N is a natural number) and inputs a divided feedback clock FCLK to the frequency comparator 420.

For example, the application timing generator 470 detects the start of reception of the data RDT by determining the start of a packet RDT and detects the end of the reception of the data RDT by determining the end of the packet RDT. Based on the detection, the application timing generator 470 performs control of the phase comparator 410 and the frequency comparator 420 such that the output (the up signal and the down signal) of the phase comparator 410 is applied to the charge pump 430 during a packet transmission period (a period from the start of reception of a packet to the end of the reception), and the output (the up signal and the down signal) of the frequency comparator 420 is applied to the charge pump 430 during a non-packet transmission period.

Accordingly, during the packet transmission period, the receiving device 400 operates in a CDR mode and outputs the clock CLK0 of the frequency f0 that is generated from the reception data RDT received from the host 1. In addition, during the non-packet transmission period, the receiving device 400 operates in a PLL mode and outputs the clock CLK0 of the frequency f0 that is generated from the clock RCLK received from the host 1.

In addition, the charge pump 430 may configure the current generated by the charge pump 430 to be different between at the time of operating in the PLL mode and at the time of operating in the CDR mode so as to acquire an optimal loop gain. Furthermore, it may be configured such that a charge pump processing the output of the phase comparator 410 and a charge pump processing the output of the frequency comparator 420 are separately arranged, and only the loop filter 440 and the VCO 450 are shared between the CDR mode and the PLL mode.

As above, according to this twelfth embodiment, by sharing the loop filter 440 and the VCO 450, the CDR operation and the PLL operation can be performed, and accordingly, the circuit scale is decreased, whereby the power consumption is reduced. In addition, by using the same VCO 450, continuous oscillation can be maintained also at the time of witching between the PLL mode and the CDR mode.

(Thirteenth Embodiment)

Figure 18:
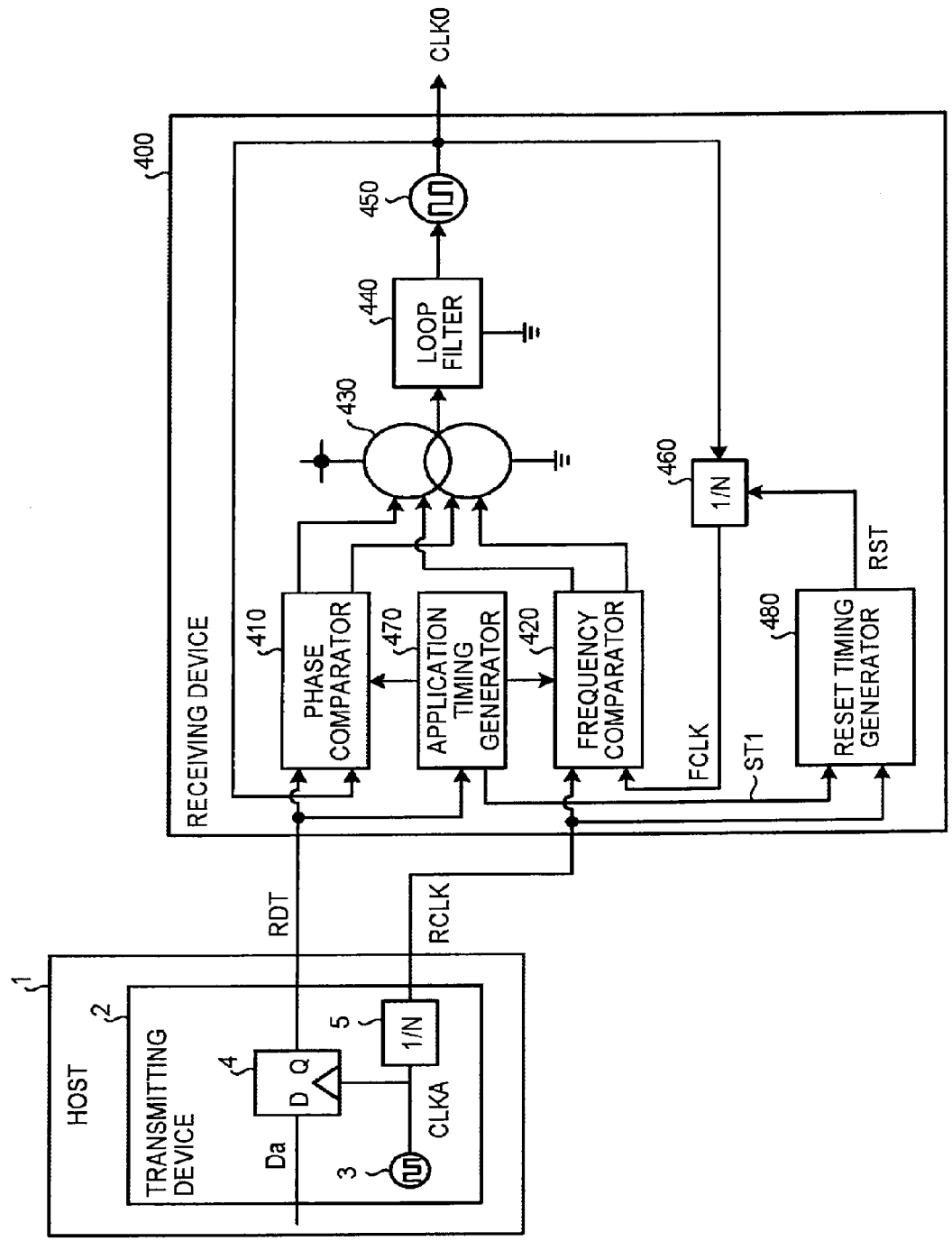
FIG. 18 is a block diagram that illustrates an example of the internal configuration of a receiving device according to a thirteenth embodiment.

In a thirteenth embodiment, when the mode is switched from the CDR mode to the PLL mode, the phase of the output of the frequency divider 460 is controlled. FIG. 18 illustrates a receiving device 400 according to the thirteenth embodiment. According to the receiving device 400 illustrated in FIG. 18, a reset timing generator 480 is added to the receiving device illustrated in FIG. 17.

In a case where there is a large phase difference between the output of the frequency divider 460 and the reception clock RCLK when the operation of the receiving device 400 is switched from the CDR mode to the PLL mode, a large phase difference is detected by the frequency comparator 420, and there is a possibility that a large frequency change in the clock CLK0 output by the VCO 450 temporarily occurs so as to follow the phase. Thus, the reset timing generator 480 generates a reset signal used for adjusting the phase of the frequency divider 460 before the operation is switched from the CDR mode to the PLL mode. The phase of the reset signal is synchronized with that of the reception clock RCLK.

The application timing generator 470, for example, inputs a state signal ST1, which becomes On at the time of the start of reception of the packet RDT and becomes Off at the time of the end of the reception of the packet RDT, to the reset timing generator 480. At an arbitrary time point during the packet reception period in which the state signal ST1 is in the On state, the reset timing generator 480 inputs a reset signal RST synchronized with the phase of the reception clock RCLK to the frequency divider 460. For example, the reset timing generator 480 inputs the reset signal RST to the frequency divider 460 at a time point at which the state signal ST1 becomes On. When this reset signal RST is input, the frequency divider 460 synchronizes the phase of the feedback clock FCLK to be output to that of the reset signal RST. Accordingly, thereafter, the feedback clock FOLK synchronized with the phase of the reception clock RCLK is output from the frequency divider 460. Thus, when the receiving device 400 is switched from the CDR mode to the PLL mode, a smooth mode transition having no frequency variation and no phase variation can be performed.

As above, according to the thirteenth embodiment, since the phase of the frequency divider 460 is adjusted so as to match the phase of the reception clock RCLK before the operation is switched from the CDR mode to the PLL mode, a large phase difference is not detected by the frequency comparator at the time of switching between the modes, and the oscillation of the VCO can be smoothly continued.

In addition, it may be configured such that the reset timing generator 480 according to the thirteenth embodiment is arranged in the receiving device 10 of each of the first to eleventh embodiments described above, and the phase of the frequency divider 55 is adjusted by the reset timing generator 480.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A receiving device comprising:
a first PLL circuit that includes a first VCO and extracts a first clock from a received first packet;
a second PLL circuit that includes a second VCO and outputs a second clock acquired by multiplying a received clock by N, the received clock having a frequency of 1/N of a bit rate of the first packet, N being a natural number; and
a control circuit that includes a first circuit and a second circuit, the first circuit applying a control signal of the second VCO to a first line during a first time from start of reception of the first packet, the first line controlling the first VCO, the second circuit causing the first PLL circuit to be in a standby state during a non-reception period of the first packet.

2. The receiving device according to claim 1, wherein the second circuit starts the first PLL circuit to operate at start time of the reception of the first packet.

3. The receiving device according to claim 1, wherein the second circuit causes the second PLL circuit to be in a standby state during a period from a timing at which synchronization of the first PLL circuit is established to end of the reception of the first packet.

4. The receiving device according to claim 1, wherein before the first PLL circuit receives the first packet, the second PLL circuit receives the clock.

5. The receiving device according to claim 1, a frequency of the first clock and a frequency of the second clock are the same.

6. The receiving device according to claim 1, wherein, when the first PLL circuit is in the standby state, a part of the first PLL circuit is in an operable state and the other of the first PLL circuit is in an operation stopped state.

7. The receiving device according to claim 6, wherein the operation stopped state is a state having power consumption lower than that of a normal state.

8. The receiving device according to claim 1, the first time is set based on the a lockup time of the first PLL circuit.

9. The receiving device according to claim 1, the control circuit is operated during the operation of the receiving device.

10. The receiving device according to claim 1, the control signal of the second VCO is a control voltage of the second VCO.

11. The receiving device according to claim 1, wherein the first PLL circuit comprises:
a first phase comparator that performs a phase comparison between the first packet and the first clock output from the first VCO;
a first charge pump that generates a current corresponding to a phase difference acquired by the first phase comparator;
a first loop filter that converts the current generated by the first charge pump into a first control voltage;
the first VCO that generates the first clock having a frequency corresponding to the first control voltage, and
wherein the first line is a connection line between an output of the first charge pump and an input of the first loop filter or a connection line between an output of the first loop filter and an input of the first VCO.

12. The receiving device according to claim 11, wherein, when the first PLL circuit is in the standby state, the first phase comparator is in an operable state, and the first charge pump, the first loop filter, the first VCO are in an operation stopped state.

13. The receiving device according to claim 11, wherein the second circuit causes the first PLL circuit to be in the standby state during the non-reception period of the first packet based on a state signal input from the first phase comparator.

14. The receiving device according to claim 13, wherein the state signal becomes on during a reception period of the first packet, and becomes off during the non-reception period of the first packet.

15. The receiving device according to claim 1, wherein the second PLL circuit comprises:
a frequency comparator that performs a frequency comparison between the received clock and a feedback clock;
a second charge pump that generates a current corresponding to a frequency difference acquired by the frequency comparator;
a second loop filter that converts the current generated by the second charge pump into a second control voltage;

the second VCO that generates the second clock having a frequency corresponding to the second control voltage; and a frequency divider that divides the second clock output from the second VCO into a frequency of 1/N and outputs the feedback clock.

16. A receiving device comprising:

a first PLL circuit that includes a first VCO and extracts a first clock from a received first packet;

a second PLL circuit that includes a second VCO and outputs a second clock acquired by multiplying a received clock by N, the received clock having a frequency of 1/N of a bit rate of the first packet, N being a natural number; and a control circuit that includes a first circuit, the first circuit applying, to a first line, a first converted signal acquired by converting a control signal of the second VCO based on voltage-to-frequency characteristics of the first and second VCOs during a first time from start of reception of the first packet, the first line controlling the first VCO.

* * * * *